(12) United States Patent
Zhang et al.

(10) Patent No.: US 11,071,223 B2
(45) Date of Patent: Jul. 20, 2021

(54) SEALING RING AND LED DISPLAY SCREEN

(71) Applicant: SHENZHEN GLOSHINE TECHNOLOGY CO., LTD., Guangdong (CN)

(72) Inventors: Xianfeng Zhang, Guangdong (CN); Yongjun Zhang, Guangdong (CN); Guoqiang Li, Guangdong (CN); Zhiqiang Gao, Guangdong (CN)

(73) Assignee: SHENZHEN GLOSHINE TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/792,206

(22) Filed: Feb. 15, 2020

(65) Prior Publication Data

US 2020/0267865 A1 Aug. 20, 2020

Related U.S. Application Data

(63) Continuation of application No. PCT/CN2019/122611, filed on Dec. 3, 2019.

(30) Foreign Application Priority Data

Feb. 14, 2019 (CN) .......................... 201910114686.X

(51) Int. Cl.
*H05K 5/06* (2006.01)
*H05K 5/00* (2006.01)
*G09F 9/33* (2006.01)

(52) U.S. Cl.
CPC .............. *H05K 5/069* (2013.01); *G09F 9/33* (2013.01); *H05K 5/0017* (2013.01)

(58) Field of Classification Search
CPC ..................................................... G06F 1/1626
See application file for complete search history.

(56) References Cited

U.S. PATENT DOCUMENTS 9,462,715 B2 * 10/2016 Nuriya .................... H05K 5/061
2003/0184514 A1 * 10/2003 Grosfeld ................. G06F 3/041
345/156

(Continued)

FOREIGN PATENT DOCUMENTS

| CN | 202646694 U | 1/2013 |
|----|-------------|--------|
| CN | 207833816 U | 9/2018 |
| JP | 2008249097 A | 10/2008 |

*Primary Examiner* — Jerry Wu

(57) ABSTRACT

Provided is a sealing ring, including a ring body, wherein the ring body includes a ring groove, a first convex ring is provided on each of the upper and lower surfaces of the bottom wall of the ring groove, and the first convex ring is a closed ring with the same extension direction as the ring groove. The side wall of the ring groove reduces the impact force of water, pressure between the first convex ring and sealed body is increased, and the sealing performance of the first convex ring is improved. Further provided is An LED display screen, including a module, box, power box and a plurality of sealing rings, wherein a first sealing ring is disposed between the power box and box, a second sealing ring is disposed between the box and module; the two rings have good sealing performance, which improves sealing performance of the LED screen.

6 Claims, 4 Drawing Sheets

(56) References Cited

U.S. PATENT DOCUMENTS

2008/0007959 A1* 1/2008 Chen .................... G02F 1/1336
362/457
2010/0102519 A1* 4/2010 Yoshitsune ............ F16J 15/106
277/641

* cited by examiner

SEALING RING AND LED DISPLAY SCREEN

CROSS REFERENCE TO RELATED APPLICATIONS

The present application is a Continuation Application of PCT Application No. PCT/CN2019/122611 filed on Dec. 3, 2019, which claims the benefit of Chinese Patent Application No. 201910114686.X filed on Feb. 14, 2019. All the above are hereby incorporated by reference.

TECHNICAL FIELD

The present application relates to the field of LED display screen technologies, and more specifically, to a sealing ring and an LED display screen.

BACKGROUND

An LED display screen is a flat panel display configured to display information such as words, images, videos and video recording signals. As LED display screens can be freely extended, seamlessly spliced, and have long operation time and good display effect with interactive technology, they are widely used in airports, shopping malls, hotels, high-speed railways, subways, cinemas, exhibitions, office buildings, and the like.

When the LED display screen is in direct contact with the air, the moisture and dust in the air will enter the LED display screen, which shortens the service life of the LED display screen, and even causes short circuit of the LED display screen and impairs functions of the LED display screen.

At present, the waterproofing grade of the LED display screen is not high enough. Especially, when the LED display screen is installed outdoors, water and dust can easily enter the LED display screen in rainy, windy or snowy weather.

SUMMARY

An objective of the present application is to provide a sealing ring to solve the technical problem of poor waterproofing performance of an LED display screen in the prior art.

To achieve the foregoing objective, the technical solution adopted in the present application is to provide a sealing ring, including a ring body, wherein the ring body includes a ring groove, a first convex ring is provided on each of the upper and lower surfaces of the bottom wall of the ring groove, and the first convex ring is a closed ring with the same extension direction as the ring groove.

Further, the ring body includes a flange formed by bending outwards from the top of the side wall of the ring groove, a second convex ring is disposed on each of the upper and lower surfaces of the flange, and the second convex ring is a closed ring with the same extension direction as the flange.

Further, the ring body includes a plurality of ring grooves, which are transversely and fixedly connected, and the cross section of the ring body is wavy.

Further, the number of the first convex rings on the upper surface of the bottom wall of the ring groove is less than or equal to the number of the first convex rings on the lower surface of the bottom wall of the ring groove.

Further, the perpendicular bisector of the connection line between the first convex rings on the upper surface of the bottom wall of the ring groove coincides with the perpendicular bisector of the connection line between the first convex rings on the lower surface of the bottom wall of the ring groove.

Further, the ring groove is a square groove, a trapezoidal groove, a triangular groove or a U-shaped groove.

Further, the height of the first convex ring on the upper surface of the bottom wall of the ring groove is less than the height of the first convex ring on the lower surface of the bottom wall of the ring groove.

A beneficial effect of the sealing ring of the present application is that, in comparison with the prior art, when the sealing ring of the present application is used, the side wall of the ring groove prevents air and water from entering the LED display screen, which reduces the impact of the air and water, so that the air and water can only enter the LED display screen through infiltration. The pressure between the first convex ring and the sealed body is increased, so that the first convex ring is squeezed to a great extent, and the infiltration of air and water can be effectively prevented. With a simple structure, the sealing ring has a good sealing effect.

A second objective of the present application is to provide an LED display screen to solve the technical problem of poor waterproofing performance of the LED display screen in the prior art.

To achieve the foregoing objective, the technical solution adopted in the present application is to provide an LED display screen including a module, a box, a power box and a plurality of sealing rings described in the foregoing technical solutions, wherein the module is fixed to the box, the power box is fixed to a side of the box that is away from the module, the sealing ring disposed between the power box and the box is a first sealing ring, and the sealing ring disposed between the box and the module is a second sealing ring.

Further, the first sealing ring is embedded into the junction of the power box and the box, the upper surface of the first sealing ring abuts against the power box, and the lower surface abuts against the box; and the second sealing ring is embedded into the junction between the box and the module, the upper surface of the second sealing ring abuts against the box, and the lower surface abuts against the module.

Further, the LED display screen includes a buckle, wherein the buckle is configured to fixedly connect the power box to the box; and the module is fixedly provided with a suction attachment and/or a sucked attachment, and the box is fixedly provided with a sucked attachment and/or a suction attachment that is sucked by and/or sucks the suction attachment and/or the sucked attachment on the module.

A beneficial effect of the LED display screen provided in the present application is as follows: compared with the prior art, the LED display screen of the present application has a better sealing effect of the first sealing ring and the second sealing ring, which can effectively prevent air and water from entering the cavity between the power box and the box or the cavity between the box and the module, so as to prevent moisture or water from entering the cavity and reducing the service life of the LED display screen and even causing short circuit of the LED display screen, thereby improving the waterproofing capability of the LED display screen.

BRIEF DESCRIPTION OF DRAWINGS

To describe the technical solutions in the embodiments of the present application more clearly, the following briefly describes the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

The reference numerals in the figures are as follows.

1. Module; 2. Box; 3. Power box;
4. First sealing ring; 41. Ring body; 411. Ring groove; 412. Flange; 42. First convex ring; 43. Second convex ring; and
5. Second sealing ring.

DESCRIPTION OF EMBODIMENTS

In order to make the technical problems to be solved in the present invention, technical solutions and beneficial effects clearer, the following describes the present application in further detail with reference to the accompanying drawings and embodiments. It should be understood that the specific embodiments described herein are merely intended to explain the application and are not intended to limit the invention.

It should be noted that when an element is referred to as "fixed" or "disposed" on another element, it can be disposed on the other element directly or indirectly. When the element is referred to as "connected to" another element, it may be connected to the other element directly or indirectly.

It should be understood that the terms "length", "width", "upper", "lower", "front", "back", "left", "right", "vertical", "horizontal", "top", "bottom", "inside", "outside" indicate directions or position relationships based on the accompanying drawings, and are merely intended to facilitate the description and simplification of the present invention, and are not intended to indicate or imply that the device or element must have specific directions and be constructed and operated with specific directions, which are not to be understood as limitations of the present invention.

In addition, the terms "first" and "second" are used for descriptive purposes only and cannot be understood to indicate or imply relative importance or implicitly indicate the number of technical features indicated. Thus, features defined as "first" and "second" may explicitly or implicitly include one or more of such features. In the description of the present invention, "a plurality of" means two or more unless otherwise specified.

Figure 2:
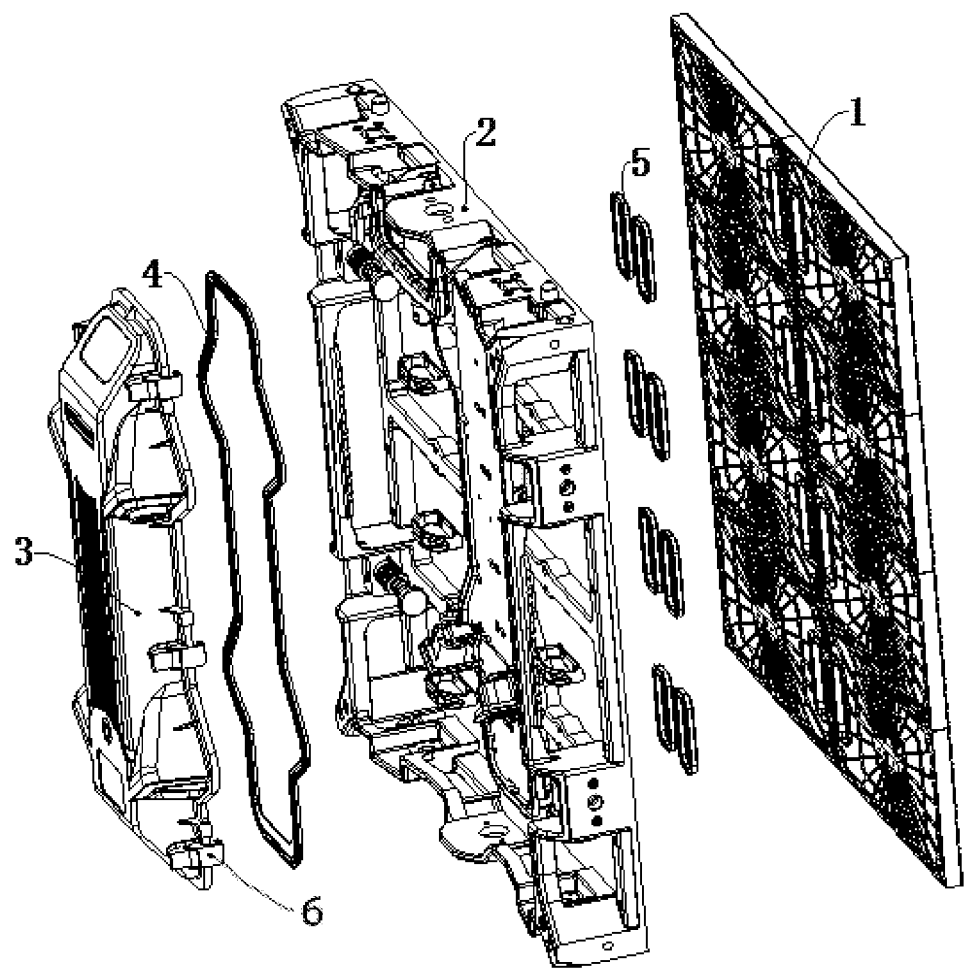
FIG. 2 is an exploded view of the LED display screen in FIG. 1.
Figure 6:
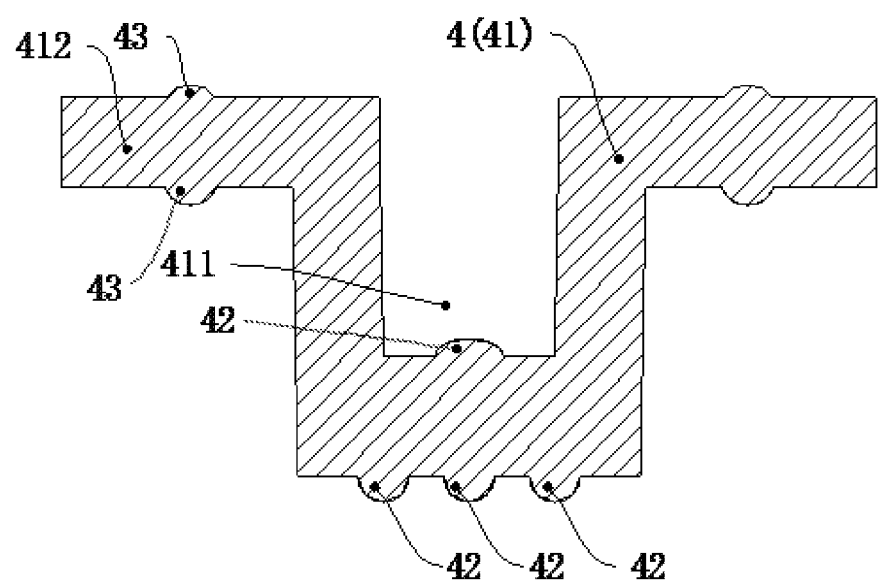
FIG. 6 is a sectional view of a first sealing ring in FIG. 4.

FIG. 2 and FIG. 6 describe a sealing ring of the present invention. The sealing ring includes a ring body 41, wherein the ring body 41 includes a ring groove 411, a first convex ring 42 is disposed on each of the upper and lower surfaces of the bottom wall of the ring groove 411, and the first convex ring 42 is a closed ring with the same extension direction as the ring groove 411.

In comparison with the prior art, when the sealing ring of the present application is used, the side wall of the ring groove 411 prevents air and water from entering the LED display screen, which reduces the impact of the air and water, so that the air and water can only enter the LED display screen through infiltration. The pressure between the first convex ring 42 and the sealed body is increased, so that the first convex ring 42 is squeezed to a great extent, and infiltration of air and water can be effectively prevented. With a simple structure, the sealing ring has a good sealing effect.

Specifically, the cross section of the first convex ring 42 is arcuate, triangular or trapezoidal.

Preferably, referring to FIG. 6, the cross section of the first convex ring 42 is arcuate. When the first convex ring 42 is used, the contact area between the first convex ring 42 and the sealed body can be reduced, and the tightness between the first convex ring 42 and the sealed body can be improved, thereby improving the sealing performance of the sealing ring.

Further, referring to FIG. 6, as a specific implementation of the sealing ring of the present invention, the ring body 41 further includes a flange 412 formed by bending outwards from the top of the side wall of the ring groove 411, a second convex ring 43 is disposed on each of the upper and lower surfaces of the flange 412, and the second ring 43 is a closed ring with the same extension direction as the flange 412. The second ring 43 can prevent moisture from entering the LED display screen, and forms a multi-layer sealing with the first ring 42, so as to prevent moisture from entering the LED display screen due to poor sealing, thereby improving the waterproofing performance of the sealing ring. In addition, the second convex ring 43 can reduce impact of water, thereby achieving a cushioning effect.

Further, in a specific implementation of the sealing ring of the present invention, the ring body 41 includes a plurality of ring grooves 411, which are transversely and fixedly connected, and the cross section of the ring body 41 is wavy. By increasing the number of ring grooves 411 the times of buffering and sealing are increased, and the sealing performance of the sealing ring is improved, which is simple and effective.

Further, referring to FIG. 6, in a specific implementation of the sealing ring of the present invention, the number of the first convex rings 42 on the upper surface of the bottom wall of the ring groove 411 is less than or equal to the number of the first convex rings 42 on the lower surface of the bottom wall of the ring groove 411, and the moisture is mainly infiltrated from the lower surface of the bottom wall of the ring groove 411. Therefore, the number of the first convex rings 42 on the lower surface of the bottom wall of the ring groove 411 is appropriately increased, thereby effectively improving the waterproofing performance of the lower surface of the bottom wall of the ring groove 411. In addition, the number of the first convex rings 42 on the upper surface of the bottom wall of the ring groove 411 can be appropriately reduced, and the contact area between the first convex rings 42 on the upper surface of the bottom wall of the ring groove 411 and the sealed body can be reduced, so that the first convex rings 42 on the upper surface of the bottom wall of the ring groove 411 are in close contact with the sealed body, thereby ensuring good sealing effect.

Specifically, one first convex ring 42 is disposed on the upper surface of the bottom wall of the ring groove 411, and three first convex rings 42 are disposed on the lower surface. The upper surface of the flange 412 is provided with one second convex ring 43, and the lower surface is provided with one second convex ring 43.

Further, referring to FIG. 6, in a specific implementation of the sealing ring of the present invention, the perpendicular bisector of the connection line between the first convex rings 42 on the upper surface of the bottom wall of the ring groove 411 coincides with the perpendicular bisector of the connection line between the first convex rings 42 on the lower surface of the bottom wall of the ring groove 411, so that the force-bearing centerpoint of the upper surface of the ring groove 411 coincides with the force-bearing centerpoint of the lower surface of the ring groove 411 and force on the bottom wall of the ring groove 411 is balanced, so that the pressure between the first convex ring 42 on the bottom wall of the ring groove 411 and the sealed body is maximized, thereby improving the sealing effect of the first convex ring 42, so as to prevent unbalanced force of the first convex ring 42 on the bottom wall of the ring from causing different gaps between the first convex 42 and the sealed body, thereby ensuring good sealing effect.

Specifically, the first convex ring 42 on the upper surface of the bottom wall of the ring groove 411 is located on the perpendicular bisector of the line connecting the three first convex rings 42 on the lower surface; and the second convex rings 43 on the upper surface of the flange 412 are in one-to-one correspondence with the second convex rings 43 on the lower surface of the flange 412.

Further, referring to FIG. 6, in a specific implementation of the sealing ring of the present invention, the ring groove 411 is a square groove, a trapezoidal groove, a triangular groove or a U-shaped groove, and different types of ring grooves 411 may be disposed based on actual requirements, thereby improving the sealing performance of the ring groove 411.

Further, referring to FIG. 6, in a specific implementation of the sealing ring of the present invention, the height of the first ring 42 on the upper surface of the bottom wall of the ring groove 411 is less than the height of the first ring 42 on the lower surface of the bottom wall of the ring groove 411, which can increase deformation of the first ring 42 on the lower surface of the bottom wall of the ring groove 411, so as to ensure the first ring 42 in closer contact with the sealed body, thereby improving the sealing performance of the first ring 42 on the lower surface of the bottom wall of the ring groove 411. The gap between the upper surface of the ring groove 411 and the sealed body is narrowed for easy installation.

Specifically, the height of the second convex ring 43 on the upper surface of the flange 412 is less than the height of the second convex ring 43 on the lower surface of the flange 412.

Figure 1:
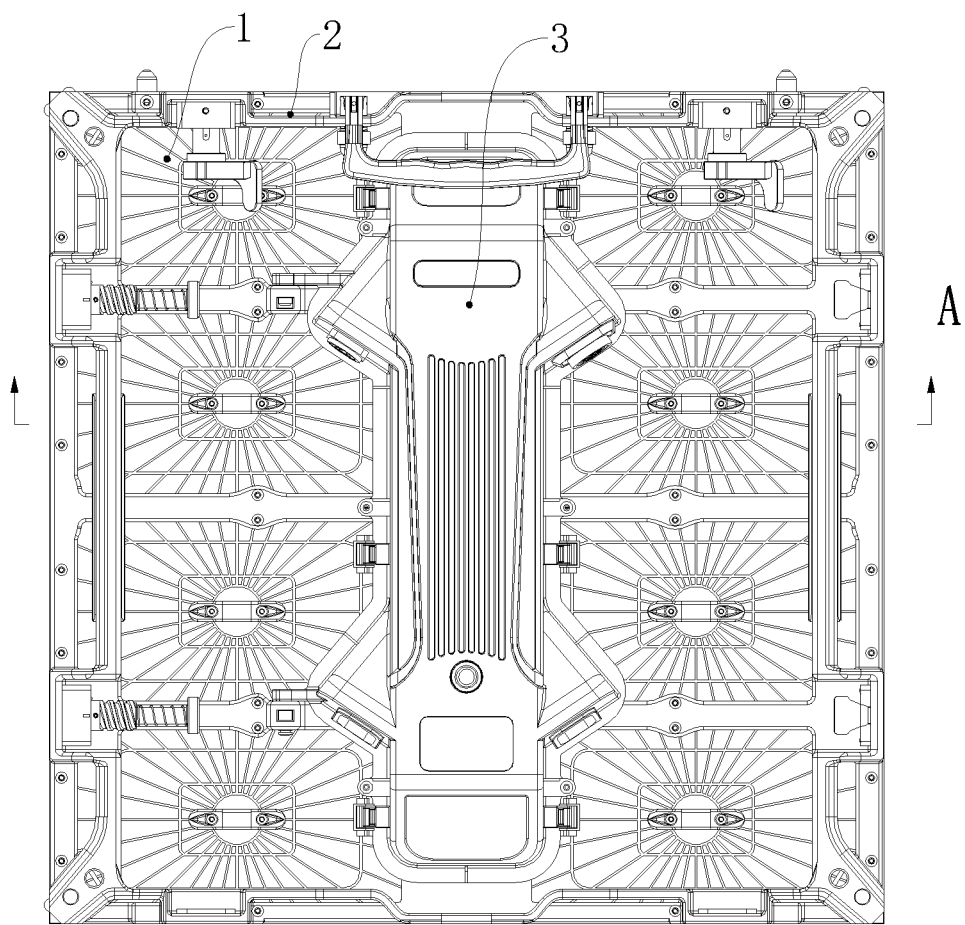
FIG. 1 is a structural schematic diagram of an LED display screen according to an embodiment of the present invention.

FIG. 1 and FIG. 2 describe an LED display screen of the present invention. The LED display screen includes a module 1, a box 2, a power box 3, and a plurality of sealing rings described in any one of the foregoing embodiments. The module 1 is fixed to the box 2, the power box 3 is fixed to one side of the box 2 away from the module 1, the sealing ring disposed between the power box 3 and the box 2 is a first sealing ring 4, and the sealing ring disposed between the box 2 and the module 1 is a second sealing ring 5.

Compared with the prior art, the LED display screen of the present application has a better sealing effect of the first sealing ring 4 and the second sealing ring 5, which can effectively prevent air and water from entering the cavity between the power box 3 and the box 2, and entering the cavity between the box 2 and the module 1, so as to avoid moisture or rain carried in the air entering the cavity and reducing the service life of the LED display screen and even causing short circuit of the LED display screen, thereby improving the waterproofing capability of the LED display screen.

Specifically, both the first sealing ring 4 and the second sealing ring 5 include a ring groove 411, and the ring groove 411 extends with a flange 412. The extension length of the flange 412 of the second sealing ring 5 is less than the extension length of the flange 412 of the first sealing ring 4.

Figure 3:
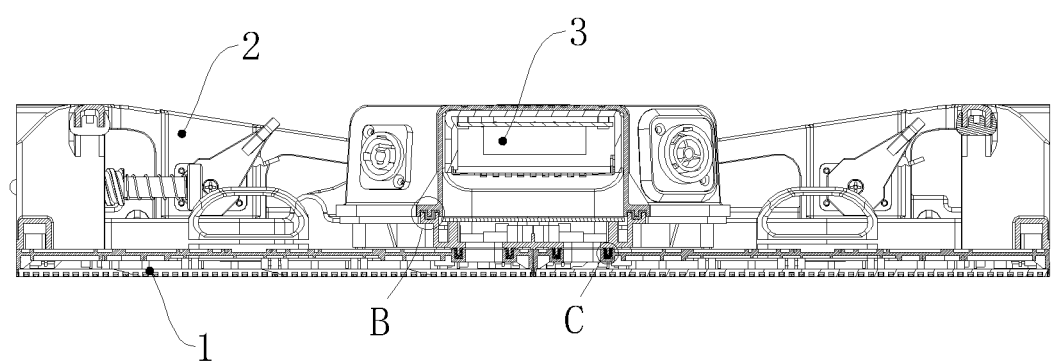
FIG. 3 is a sectional view at A in FIG. 1.
Figure 4:
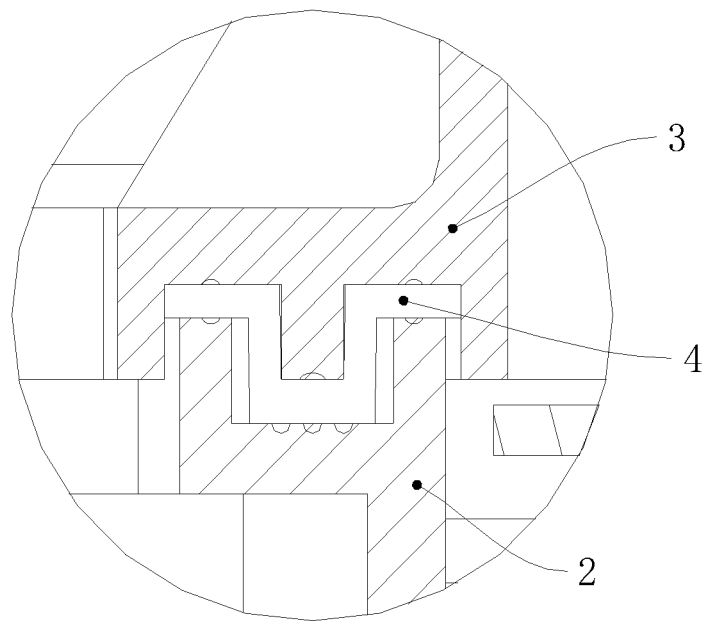
FIG. 4 is an enlarged view at B in FIG. 3.
Figure 5:
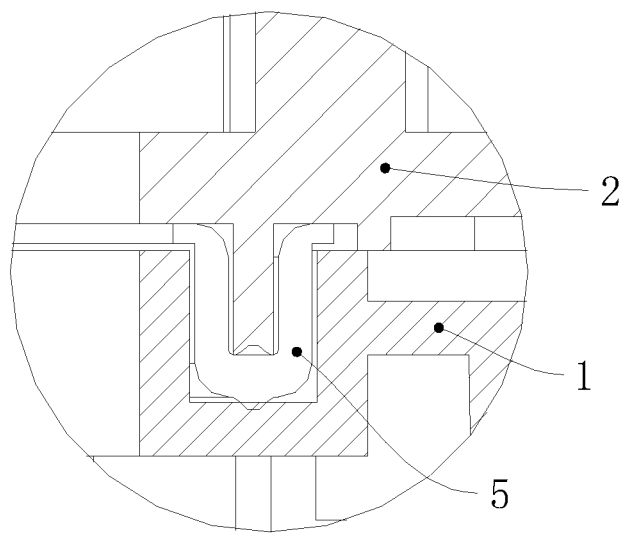
FIG. 5 is an enlarged view at C in FIG. 3.

Further, referring to FIG. 3 to FIG. 5, in a specific implementation of the LED display screen of the present invention, the first sealing ring 4 is embedded into the junction of the power box 3 and the box 2, and the upper surface of the first sealing ring 4 abuts against the power box 3, and the lower surface abuts against the box 2, so as to prevent moisture from entering the junction of the power box 3 and the box 2 and resulting in short circuit of the LED display screen.

The second sealing ring 5 is embedded into the junction of the box 2 and the module 1, and the upper surface of the second sealing ring 5 abuts against the box 2, and the lower surface of the second sealing ring 5 abuts against the module 1, so as to prevent moisture from entering the junction of the box 2 and the module 1 and resulting in short circuit of the LED display screen.

Specifically, one first sealing ring 4 is provided, and a plurality of the second sealing rings 5 are provided.

Further, in a specific implementation of the present invention, the LED display screen includes a buckle, wherein the buckle is configured to fixedly connect the power box 3 to the box 2.

The module 1 is fixedly provided with a suction attachment, and the box 2 is fixedly provided with a sucked attachment that is sucked by the suction attachment on the module 1; or the module 1 is fixedly provided with a sucked attachment, and the box 2 is fixedly provided with a suction attachment that sucks the sucked attachment on the module 1; or the module 1 is fixedly provided with a suction attachment and a sucked attachment, and the box 2 is fixedly provided with a sucked attachment and/or a suction attachment that is sucked by and/or sucks the suction attachment and/or the sucked attachment on the module 1; and the power box 3 is fixedly connected to the box 2 by using the buckle, and the box 2 is fixed to the module 1 by using the suction attachment and the sucked attachment, which makes disassembly and maintenance easy, so that the angle of view and flatness of the module 1 are perfect, thereby avoiding dismantling inconvenience when bolts are used.

Specifically, the suction attachment is a magnetic element (such as a magnet) and the sucked attachment is a ferromagnetic element (such as an iron block).

Further, unless otherwise required by context, singular terms shall include pluralities and plural terms shall include the singular. Thus, as used herein and in the claims, the singular forms include the plural reference and vice versa unless the context clearly indicates otherwise.

The foregoing descriptions are merely preferred embodiments of the present invention, and are not intended to limit the present invention. Any modification, equivalent replacement and improvement made within the spirit and principles of the present application shall fall within the protection scope of the present invention.

What is claimed is:

1. An LED display screen, comprising: a module, a box and a power box, wherein the module is fixed to a side of the box, the power box is fixed to another opposite side of the box; and further comprising: a plurality of the sealing rings, wherein the sealing ring disposed between the power box and the box is a first sealing ring, and the sealing ring disposed between the box and the module is a second sealing ring;

each of the plurality of sealing rings comprising a ring body, wherein the ring body comprises a ring groove formed by a bottom wall and opposite side walls, at least one first convex ring is disposed on each of upper and lower surfaces of the bottom wall of the ring groove, and each of the at least one first convex ring is a closed ring with a same extension direction as the ring groove; the ring body further comprises a flange formed by bending outwards from a top of the side wall of the ring groove opposite to the bottom wall, at least one second convex ring is disposed on each of upper and lower surfaces of the flange, and each of the at least one second convex ring is a closed ring with a same extension direction as the flange; wherein the number of the first convex rings on the upper surface of the bottom wall of the ring groove is less than the number of the first convex rings on the lower surface of the bottom wall of the ring groove; a perpendicular bisector of the connection line of all the first convex rings on the upper surface of the bottom wall of the ring groove coincides with a perpendicular bisector of the connection line of all the first convex rings on the lower surface of the bottom wall of the ring groove.

2. The sealing ring according to claim 1, wherein the ring body comprises a plurality of ring grooves, which are transversely and fixedly connected, and the cross section of the ring body is wavy.

3. The sealing ring according to claim 1, wherein the ring groove is a square groove, a trapezoidal groove, a triangular groove or a U-shaped groove.

4. The sealing ring according to claim 1, wherein the height of the first convex ring on the upper surface of the bottom wall of the ring groove is less than the height of the first convex ring on the lower surface of the bottom wall of the ring groove.

5. The LED display screen according to claim 1, wherein the first sealing ring is embedded into the junction of the power box and the box, the upper surface of the first sealing ring abuts against the power box, and the lower surface abuts against the box; and the second sealing ring is embedded into the junction between the box and the module, the upper surface of the second sealing ring abuts against the box, and the lower surface abuts against the module.

6. The LED display screen according to claim 1, further comprising a buckle, wherein the power box is fixedly connected to the box by using the buckle.

* * * * *